(12) United States Patent
DuMond et al.

(10) Patent No.: US 8,567,323 B1
(45) Date of Patent: Oct. 29, 2013

(54) PALLET-LIKE BASE FOR DATACENTER EQUIPMENT RACKS

(71) Applicants: Jody DuMond, Fairfax, VA (US); Raleigh Stewart, Centerville, VA (US)

(72) Inventors: Jody DuMond, Fairfax, VA (US); Raleigh Stewart, Centerville, VA (US)

(73) Assignee: E. K. Fox & Associates, Ltd., Fairfax, VA (US)

( * ) Notice: Subject to any disclaimer, the term of this patent is extended or adjusted under 35 U.S.C. 154(b) by 0 days.

(21) Appl. No.: 13/674,135

(22) Filed: Jan. 6, 2013

(51) Int. Cl.
*B65D 19/00* (2006.01)

(52) U.S. Cl.
USPC ........................................... 108/51.11

(58) Field of Classification Search
USPC .............. 108/51.11, 52.1, 56.1, 57.17, 57.21, 108/57.22, 57.25, 57.3–57.33
See application file for complete search history.

(56) References Cited

U.S. PATENT DOCUMENTS

| | | | | |
|---|---|---|---|---|
| 5,285,731 A | * | 2/1994 | McIntyre | 108/51.3 |
| 5,483,875 A | * | 1/1996 | Turecek et al. | 108/51.3 |
| 5,833,207 A | * | 11/1998 | Hagenhoff et al. | 248/678 |
| 6,135,030 A | * | 10/2000 | Besaw | 108/51.3 |
| 6,396,450 B1 | | 5/2002 | Gilbert | |
| 2002/0069796 A1 | * | 6/2002 | Olvey et al. | 108/56.1 |
| 2008/0042378 A1 | | 2/2008 | Dick et al. | |

* cited by examiner

*Primary Examiner* — Matthew Ing
(74) *Attorney, Agent, or Firm* — John L. Sotomayor

(57) ABSTRACT

An apparatus is described that forms a base resembling a pallet that can be retrofitted onto computer equipment racks, and other datacenter equipment, in order to allow the equipment or equipment rack to be moved with a moving device such as a pallet jack or one or more safe movers. Using a moving device to move items of equipment or and equipment rack allows the equipment or rack to remain fully loaded and in a vertical orientation, to help minimize downtime, minimize equipment damage, and maximize personnel safety.

16 Claims, 5 Drawing Sheets

PALLET-LIKE BASE FOR DATACENTER EQUIPMENT RACKS

COPYRIGHT NOTICE

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

BACKGROUND

In a data center environment, relocating a rack of equipment traditionally requires almost all of the servers, switches, and other pieces of racked gear to be removed from the rack prior to moving the rack. An equipment rack is typically sized at approximately 19 inches wide, approximately 30 inches from front to back, and may have a variable height, but is typically approximately 72 to 84 inches in height. The equipment rack has channels, conduits and connections for power, cooling, and data communications such that electronic equipment may be inserted into slots in the rack and powered and cooled through the use of the rack services. Removing equipment from the rack prior to moving the rack reduces the weight, thus permitting the rack to be readily relocated. The rack is then moved either by attempting to manually move it across the floor, or by using a hand truck (dolly) to move the rack. Moving the rack using a hand truck or dolly requires the rack to be inclined at some angle to the floor, moving the rack out of perpendicular orientation with the floor. Relocating datacenter equipment that is not installed within a rack but is nevertheless large and heavy presents issues similar to the relocation of a loaded equipment rack.

Moving a rack while it is still fully loaded has some advantages. Chief among these advantages is the fact that moving a loaded rack saves the time required to disconnect and reconnect all of the pieces of equipment that are installed in the rack from the power and data connections of rack services, which can be quite tedious. Moving a rack when fully loaded also removes much of the risk of cabling errors that may occur when the network data, communication, and power cables are reconnected to the devices installed in the rack.

Moving a fully loaded rack or large and heavy items of datacenter equipment also presents some major challenges. Chief among the challenges is that a fully loaded rack is extremely heavy, in the range of approximately 2000-3000 pounds. Moving the fully loaded rack and large and heavy equipment using some methods presents risks of equipment damage, damage to the rack, and personnel injury. Attempting to push a loaded rack or heave equipment item to move it presents a risk of the equipment or rack tipping over. Moving a loaded rack with a hand truck reduces some of these risks, but typically racks, and the equipment they house, and large, heavy equipment items are not designed to be moved from a perpendicular orientation with respect to the floor and damage may result. There is also the risk of the rack or other equipment tipping when attempting to restore the rack or other equipment to an upright, perpendicular orientation with respect to the floor.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which.

DETAILED DESCRIPTION

Figure 1:
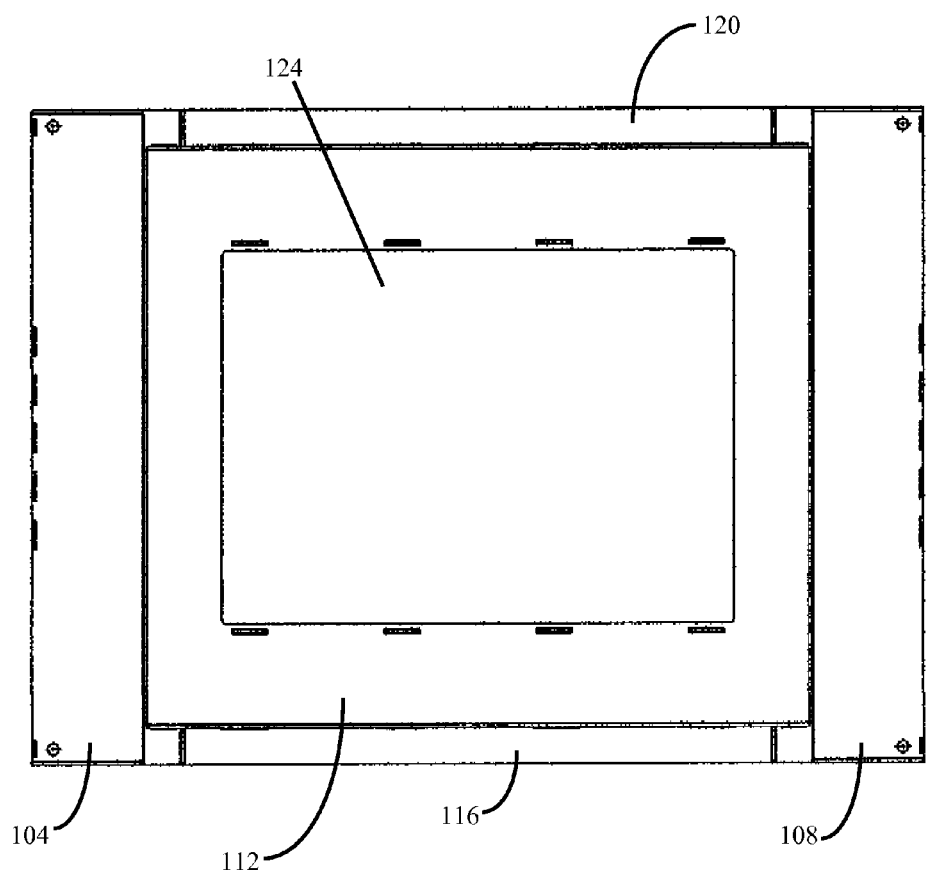
FIG. 1 is a diagram of a top view of a pallet-like rack base consistent with certain embodiments of the present invention.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

There is a need for a device or apparatus to permit the relocation of a datacenter equipment rack while the equipment rack is fully or partially loaded, and without having to remove and reinsert any equipment from the equipment rack before or after the relocation event. Additionally, the device or apparatus may be used to support and relocate datacenter equipment other than a datacenter equipment rack. Such a device or apparatus could be installed at the base of the equipment rack or other item of datacenter equipment and be of sufficient sturdiness, size and shape to support the fully or partially loaded equipment rack or other item of datacenter equipment before, during and after a relocation action. In some embodiments, the device or apparatus, which for purposes of this disclosure will be termed a pallet-like base for a datacenter equipment rack, may be installed as a base member of a datacenter equipment item or equipment rack. The pallet-like base as installed is configured to permit the insertion of a device capable of supporting and moving a fully loaded rack such as a pallet jack or one or more safe movers beneath the pallet-like base supporting the datacenter equipment item or equipment rack. The device being used to move the fully loaded rack or other equipment item, once inserted under or in designated openings in the pallet-like base, may be used to raise the equipment or equipment rack vertically, with the strain of the weight of the equipment or equipment rack being borne by the pallet-like base. The pallet-like base thus permits the heavy datacenter equipment or equipment racks to be lifted and relocated without tilting the equipment or equipment rack away from a vertical orientation during the relocation operation.

Turning now to FIG. 1, consistent with certain embodiments of the invention this figure presents an exemplary view of the top of a pallet-like base that may be attached as a base to datacenter equipment or equipment racks. In this exemplary embodiment, the pallet-like base has a left side base support 104 and a right side base support 108. Each of the left side support 104 and right side support 108 are composed of a material of sufficient thickness and structural strength to support the full weight of a particular item of datacenter equipment or a fully loaded datacenter equipment rack. Materials that may be used to construct the pallet-like base include structural steel alloys, layered composite materials, other metallic alloys, or any other material capable of supporting the intended equipment item or equipment rack weight during relocation actions. The left side base support 104 and the right side base support 108 bottom surfaces are in contact with the floor, and the upper surfaces are in contact with the bottom legs or bottom rack members of the equipment or equipment rack that is installed on top of the pallet-like base. The pallet-like base supports are separated by the central pedestal 112 and each base support is connected to the central pedestal 112. The left side base support 104 is connected along the left side of the central pedestal 112, and the right side base support is connected along the right side of the central pedestal 112 such that the base supports are contiguous along the entire sides of the central pedestal 112. The central pedestal 112 is of sufficient thickness to support the front and back frame members of a datacenter item of equipment or equipment rack when the said item of equipment or equipment rack is installed in contact with the top surface of the central pedestal 112 of the pallet-like base. The central pedestal 112 is connected to a front flange 116 and a back flange 120 where the front flange 116 and the back flange 120 are disposed at the bottom edge of the central pedestal 112, extending horizontally from the central pedestal 112 front and back edges. The front and back flanges are contiguously connected from the left side support 104 along the front and back edges of the central pedestal 112 to the right side support 108. The front and back edges of the central pedestal 112 are set back from the front and back edges of the base supports a distance equal to the width of the front flange 116 and back flange 120, forming a central pedestal 112 that is shorter than the length dimension of the base supports. In this exemplary embodiment, the length of the base supports is equal to the width of the front flange 116, the central pedestal 112, and the back flange 120 combined.

The central pedestal 112 also has a central cutout 124 that is left as an opening to permit the ingress and egress of any cabling or connection wiring required by the item of equipment or equipment rack. The central cutout 124 may provide an opening as large as possible to accommodate cabling, as well as provide for cooling, air flow, and heat dissipation into and out of the item of equipment or equipment rack during equipment operation. However, the size of the central cutout 124 is constrained by the need to maintain the load bearing integrity of the central pedestal 112. Thus, the central cutout 124 size will be a function of the material surface area needed by the load bearing surface of the central pedestal 112.

When installed on the pallet-like base, the item of equipment or equipment rack will rest on the left base support 104, the right base support 108, and the central pedestal 112. The pallet-like base must, therefore, be of approximately the same length and width dimensions as the item of equipment or equipment rack to be supported on the pallet-like base. In a non-limiting example, for an equipment rack having a width dimension of 30 inches and a depth dimension from front to back of 19 inches, the pallet-like base would have a width of approximately 30 inches and a front to back depth dimension of approximately 19 inches. In this non-limiting example, the left base support 104, central pedestal 112, and right base support 108 would have a combined width dimension of approximately 30 inches, and the base supports would have a front to back depth dimension of approximately 19 inches. The front and back flanges plus the central pedestal 112 would also have a combined depth dimension of approximately 19 inches. These dimensions are dependent upon the item of equipment or equipment rack that will be installed on the pallet-like base. It is to be understood that these dimensions may be modified to accommodate the equipment or rack type to be installed on the pallet-like base and should in no way be considered limiting on the overall dimensions of the pallet-like base.

Figure 2:
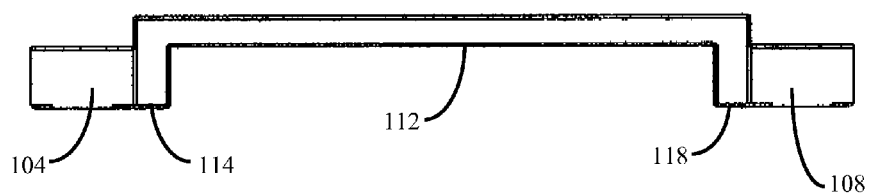
FIG. 2 is a diagram of a front view of a pallet-like rack base consistent with certain embodiments of the present invention.

Turning now to FIG. 2, consistent with certain embodiments of the invention this figure presents a front view of the pallet-like base. In this exemplary embodiment, the pallet-like base has a left side base support 104 and a right side base support 108. The bottom surfaces of the base supports rest upon a floor or other horizontal surface, with an item of equipment or equipment rack resting upon the upper surfaces of the base supports. The central pedestal 112, disposed between the left base support 104 and the right base support 108, is connected to the base supports. The central pedestal 112 is shaped substantially like an inverted "U" with the right leg 114 and left leg 118 of the "U" oriented in a vertical direction and resting upon the floor or other horizontal surface and supporting the middle portion of the central pedestal 112, which forms a horizontal surface through the advent of a ninety degree angle connection between the middle of the central pedestal 112 and the two base supports 114, 118. Each leg of the central pedestal 112 is connected to the base supports, with each leg having a larger vertical dimension than the base supports such that the body of the central pedestal 112 is raised above the top surfaces of the base supports. The middle potion of the central pedestal 112 is raised above the surface of the floor or other horizontal surface such that when the base supports and the legs of the central pedestal 112 are in contact with the flooring or other horizontal surface, the middle section is not in contact with the floor. The raised middle portion of the central pedestal 112 forms a cavity between the floor or other horizontal surface and the central pedestal 112. The cavity is of sufficient height to permit the insertion of a lifting device to raise the pallet-like base and move the pallet-like base and the installed equipment or equipment rack while in a vertical orientation.

In a non-limiting example, a pallet jack may be used as the lifting device by causing the lifting forks of a pallet jack to be inserted into the cavity. Once the lifting forks of a pallet jack are inserted into the cavity, the pallet jack may lift the pallet-like base. The equipment or equipment rack installed on top of the pallet-like base will be raised with the pallet-like base with the base supports (104,108) and central pedestal 112 supporting the weight of the item of equipment or equipment rack. In an alternative embodiment, the lifting device may be one or more safe movers instead of a pallet jack, which will be described more fully herein below with regard to FIG. 3.

Figure 3:
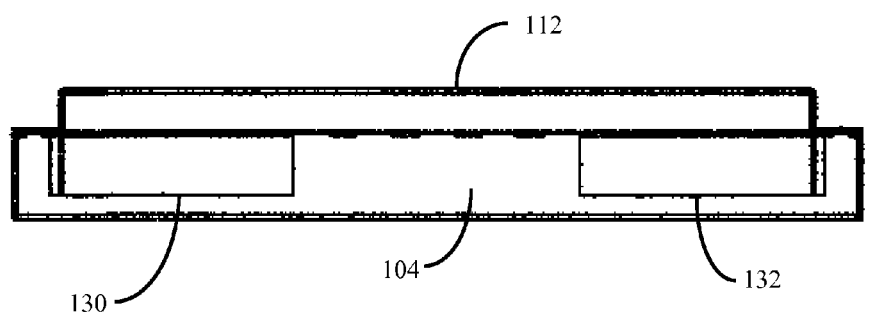
FIG. 3 is a diagram of a side view of a pallet-like rack base consistent with certain embodiments of the present invention.

Turning now to FIG. 3, consistent with certain embodiments of the invention this figure presents a side view of the pallet-like base. In a non-limiting embodiment, this figure illustrates the side view of the left side base support 104 and the side view of the central pedestal 112. The left side base support 104 is constructed as a hollow, square-sided tube. The left side base support 104, in combination with the right side base support 108 and the central pedestal 112, is constructed of a steel alloy of sufficient thickness to support the weight of an item of equipment or an equipment rack that may be installed on top of the pallet-like base.

To assist with moving the rack or equipment installed upon the pallet-like base, the left side base support 104 has one or more cutouts. In this exemplary embodiment, the left side base support 104 has a rear cutout 130, disposed at the back of the pallet-like base, and a front cutout 132, disposed at the front of the pallet-like base. The cutouts 130, 132 are of sufficient size and orientation to permit the insertion of the front lifting forks of a device for raising and moving the pallet-like base such as, in a non-limiting example, one or more safe movers. Upon inserting the front forks of a safe mover on each side of the pallet-like base, the pallet-like base may be raised above the floor or other horizontal surface and the equipment or equipment rack installed upon the pallet-like base may then be moved while retaining a vertical orientation during the move.

The front and rear flanges (not shown) connect the left side base support 104 and the right side base support 108 to provide greater structural integrity and support for the weight of the item of equipment or equipment rack installed on the pallet-like base. In other non-limiting embodiments the base supports may have more or fewer cutouts to permit additional cabling or other ingress or egress to the item of equipment or equipment rack.

Figure 4:
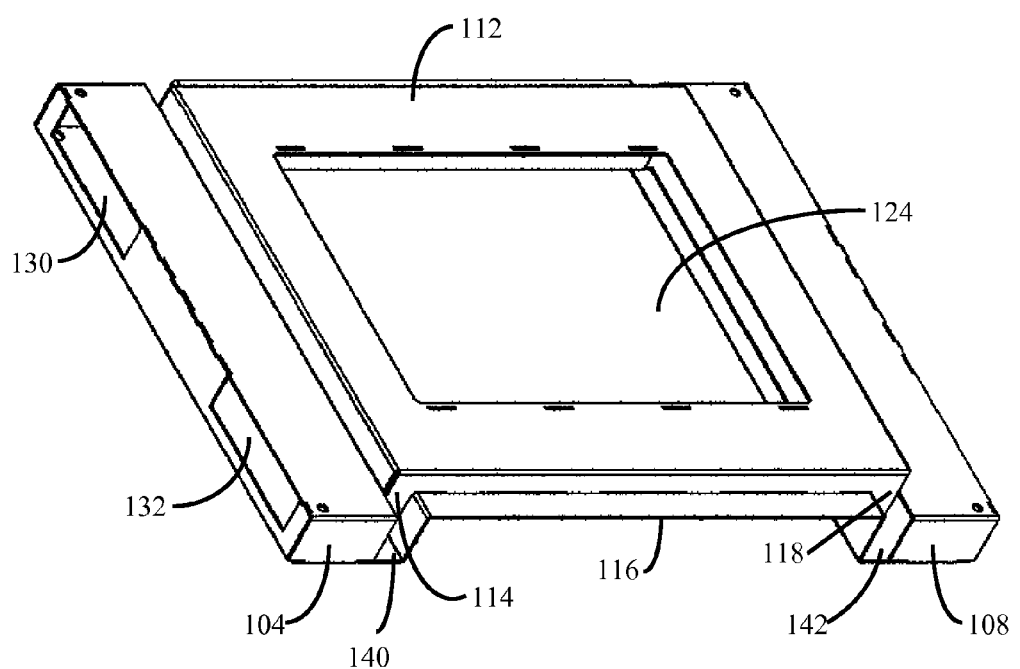
FIG. 4 is a diagram of a tilted top view of a pallet-like rack base consistent with certain embodiments of the present invention.

Turning now to FIG. 4, for certain embodiments consistent with the invention this figure presents a diagram of a tilted top view of a pallet-like rack base. The pallet-like base has a left side base support 104 and a right side base support that are each configured as hollow construction members with a square cross-section. Each base support is constructed of a steel alloy of sufficient strength to support a proportional share of the weight of an item of equipment or equipment rack that may have a weight in the range of approximately 2000 to 3000 pounds when fully configured. Each base support is of a lower profile than a central pedestal 112 configured between the left side base support 104 and the right side base support 108. The central pedestal 112 is structurally connected to the left side base support 104 and the right side base support 108, forming a connecting pedestal body between the base supports. The connection between the central pedestal 112 and the base supports may be formed in any manner that provides a secure and unbreakable bond between the sides of the central pedestal 112 and the base supports including forming from a single piece of structural steel alloy, spot welding, arc welding, or any other manner of joining steel members together. In this exemplary embodiment, the central pedestal 112 has a right upright section 114 and a left upright section 118 that each form a 90 degree angle with the horizontal surface of the central pedestal 112. The upright sections are of sufficient height to raise the horizontal surface of the central pedestal 112 above the height of each of the base supports and to raise the horizontal surface of the central pedestal 112 above the surface of the floor or other horizontal surface such that when the base supports and the legs of the central pedestal 112 are in contact with the flooring or other horizontal surface, the horizontal surface of the central pedestal 112 is not in contact with the floor. The bottom surface of the central pedestal 112 is raised above the floor or other horizontal surface providing a cavity underneath the central pedestal 112 of sufficient height to permit the insertion of a moving device beneath the central pedestal 112.

Additionally, connected to the front and rear surfaces of the central pedestal 112 are a front flange 116 and a rear flange 120. The widths of the front flange 116, the central pedestal 112, and the rear flange 120, when combined, are approximately the same measurement as the front to back depth dimension of the base supports. The front flange 116 and the rear flange 120 rest at each end, where the flanges connect to the base supports, on the floor or other horizontal surface, bend through 90 degrees to connect to the inner edges of the upright sections (114, 118) of the central pedestal 112, and bend through 90 degrees again to connect to the bottom edge of the horizontal surface of the central pedestal 112. In this manner, the front flange 116 and back flange 120 each form a continuous connection between the left base support 104, along the central pedestal 112, to the right base support 108, thus providing support and structural strength to the pallet-like rack base.

In this exemplary embodiment the left and right base supports (104,108) may also have one or more cutouts to permit ingress and egress for cabling, power, data connectivity or other wired connections between the item of equipment or equipment rack installed on the pallet-like base and to permit the use of an alternative moving device, such as, in a non-limiting example, one or more safe movers. A front cutout 132 and rear cutout 130 are shown in the left base support 104 by way of example and not of limitation. Cabling that is inserted into the pallet-like base through one of the cutouts may be pulled through a cabling channel 140 on the left side or a cabling channel 142 on the right side of the pallet-like base to permit cables and wires to be connected to the item of equipment or equipment in the equipment rack installed on the pallet-like base. When installed on the pallet-like base, an item of equipment or equipment rack may be fully connected to all power, data, communication, and other connections required to permit the full function of the equipment while maintaining the ability to readily and easily raise, relocate, and lower the item of equipment or equipment rack installed on the pallet-like base.

Figure 5:
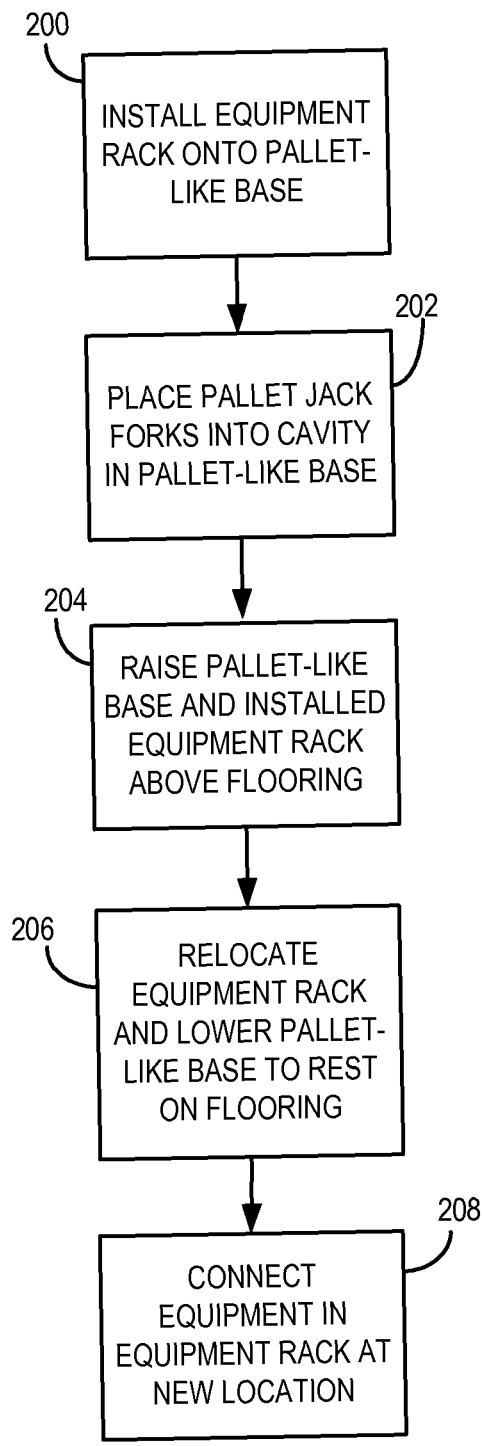
FIG. 5 is a view of an illustrative process for use of a pallet-like rack base when moving a fully loaded equipment rack consistent with certain embodiments of the present invention.

Turning now to FIG. 5, for certain embodiments of the invention is a view of an illustrative process for use of a pallet-like rack base when moving a fully loaded equipment rack consistent with certain embodiments of the present invention. At 200, to facilitate the installation or relocation of heavy datacenter equipment or equipment racks, the item of equipment or equipment rack may be installed on a pallet-like base that will have length and width dimensions of approximately the same dimensions as the item of equipment or equipment rack. In a non-limiting example, an equipment rack that is approximately 19 inches wide and approximately 30 inches in a depth dimension from the front of the equipment rack to the back of the equipment rack, a pallet-like base will also have a width dimension of approximately 19 inches and a depth dimension of approximately 30 inches. Other items of equipment and equipment racks may require different width and depth dimensions. This should not be considered limiting as the pallet-like base may be designed and built to accommodate other dimensions without affecting the utility of the pallet-like base.

At 202, after the item of equipment or equipment rack has been installed on the pallet-like base, the forks of a moving device may be inserted into the cavity formed between the central pedestal 112 of the pallet-like base and the floor, or into one or more of the pre-determined cutouts in the sides of the pallet-like base. The item of equipment or the equipment in an equipment rack may be disconnected from power, data, and communications connections without unloading the item of equipment or equipment rack in preparation for relocating the item of equipment or equipment rack. At 204, the desired moving device may be used to raise the pallet-like base, and the installed equipment or equipment rack, above the level of the flooring such that the item of equipment or equipment rack is no longer in contact with the floor. At 206, the moving device may be employed to relocate the item of equipment or equipment rack as a unit, without having to unload any part of the item of equipment or the items of equipment installed within the equipment rack. When positioned at the new location the item of equipment or equipment rack may be lowered by the moving device until the pallet-like base is once again in contact with the floor and the moving device removed from the pallet-like base. At 208, the item of equipment or equipment in the equipment rack may then be reconnected to power, data, and communications services to return all equipment to full service.

A device and apparatus forming a base for datacenter equipment, having at least two base support members, a central pedestal interposed in a horizontal orientation between and connected to vertical support members, and where the vertical support members connected to the central pedestal and base support members.

The vertical support members are of sufficient height to raise the central pedestal above the upper surface of the base support members and form a cavity between the bottom surface of the central pedestal and a floor or other surface when the base support members rest on a floor or other horizontal surface. The base support members and central pedestal of having sufficient horizontal planar dimensions, length and width, to fully support an item of equipment or equipment rack when installed on the device, where the item of equipment or equipment rack is moved by raising, relocating, and lowering the device or apparatus.

The base supports are formed of hollow structural members having a square cross-section and where the structural members may be constructed of structural steel, composite fiber, other metallic alloys, or any other structural material of sufficient strength to support the weight of a rack having a weight in the range of approximately 3000 pounds. The central pedestal and base supports of the device or apparatus are further connected by a front flange and a back flange, and the base supports have one or more cutouts in the surface facing away from the central pedestal to permit ingress and egress to the interior of the base supports.

The front flange and the back flange are connected along the bottom and side edges of the central pedestal to form a channel from the interior of the base supports to permit power, data, and communications cables to be connected through the device or apparatus from exterior sources to the equipment or equipment rack installed upon the device or apparatus. Additionally, the central pedestal has a cutout in the central portion of the central pedestal horizontal member to permit the circulation of cooling air or other coolant gases. The cavity formed between the bottom surface of the central pedestal and a floor or other horizontal surface is of sufficient vertical dimension to permit the insertion of a moving equipment apparatus such as a pallet jack. Additionally, the one or more cutouts are oriented to permit the insertion of the forks of an alternative moving device such as a safe mover.

An apparatus forming a base for datacenter equipment, having at least two base support members with a central pedestal interposed between and connected to vertical support members. The vertical support members connected to the central pedestal and base support members and of sufficient height to raise the central pedestal above the upper surface of the base support members and form a cavity between the bottom surface of the central pedestal and a floor or other surface when the base support members rest on the floor or other horizontal surface. The base support members and central pedestal of sufficient dimension to support an item of equipment or equipment rack when installed on the apparatus, where the item of equipment or equipment rack is relocated by raising, relocating, and lowering the apparatus.

The apparatus base supports are formed of hollow structural members having a square cross-section and have one or more cutouts in the surface facing away from the central pedestal to permit ingress and egress to the interior of the base supports. The central pedestal and base supports are further connected by a front flange and a back flange where the front flange and the back flange are connected along the bottom and side edges of the central pedestal to form a channel from the interior of the base supports. Power, data, and communications cables are connected through the apparatus from exterior sources to the equipment or equipment rack installed upon the apparatus. The central pedestal of the apparatus has a cutout in the central portion of the central pedestal horizontal member. The cavity formed between the bottom surface of the central pedestal and a floor or other horizontal surface is of sufficient vertical dimension to permit the insertion of a moving equipment apparatus. In addition, the one or more cutouts are oriented to permit the insertion of the forks of a safe mover.

The above overviews are intended to illustrate exemplary embodiments which will be best understood in conjunction with the detailed description to follow, and are not intended to limit the scope or meaning of the appended claims.

While certain illustrative embodiments have been described, it is evident that many alternatives, modifications, permutations and variations will become apparent to those skilled in the art in light of the foregoing description.

What is claimed is:

1. An apparatus forming a base for datacenter equipment, comprising:
    at least two base support members;
    a central pedestal interposed between and connected to vertical support members;
    the vertical support members connected to the central pedestal and base support members;
    said vertical support members of sufficient height to raise the central pedestal above the upper surface of the base support members and form a cavity between the bottom surface of the central pedestal and a floor or other surface when the base support members rest on the floor or other horizontal surface;
    a front flange and a back flange extending horizontally, each flange continuously connecting the base support members to the vertical support members to the central pedestal and forming a continuous support to the front and back edges of the base apparatus;
    the base support members and central pedestal of sufficient dimension to support an item of equipment or equipment rack when installed on the apparatus, where the item of equipment or equipment rack is relocated by raising, relocating, and lowering the apparatus.

2. The apparatus of claim 1, where the base supports are formed of hollow structural members having a square cross-section.

3. The apparatus of claim 2, where the base supports have one or more cutouts in the surface facing away from the central pedestal to permit ingress and egress to the interior of the base supports.

4. The apparatus of claim 3, where the one or more cutouts are oriented to permit the insertion of the forks of a safe mover.

5. The apparatus of claim 1, where the front flange and the back flange are connected along the bottom and side edges of the central pedestal to form a channel from the interior of the base supports.

6. The apparatus of claim 1, where a cutout provides for ingress and egress of power, data, and communications cables connected through the apparatus from exterior sources to the equipment or equipment rack installed upon the apparatus.

7. The apparatus of claim 1, where the central pedestal has a cutout in the central portion of the central pedestal horizontal member.

8. The apparatus of claim 1, where the cavity formed between the bottom surface of the central pedestal and a floor or other horizontal surface is of sufficient vertical dimension to permit the insertion of a moving equipment apparatus.

9. A device forming a base for datacenter equipment, comprising:
   at least two base support members;
   a central pedestal interposed in a horizontal orientation between and connected to vertical support members;
   the vertical support members connected to the central pedestal and base support members;
   said vertical support members of sufficient height to raise the central pedestal above the upper surface of the base support members and form a cavity between the bottom surface of the central pedestal and a floor or other surface when the base support members rest on a floor or other horizontal surface;
   a front flange and a back flange extending horizontally, each flange continuously connecting the base support members to the vertical support members to the central pedestal and forming a continuous support to the front and back edges of the base apparatus;
   the base support members and central pedestal of sufficient dimension to support an item of equipment or equipment rack when installed on the device, where the item of equipment or equipment rack is moved by raising, relocating, and lowering the device.

10. The device of claim 9, where the base supports are formed of hollow structural members having a square cross-section.

11. The device of claim 10, where the base supports have one or more cutouts in the surface facing away from the central pedestal to permit ingress and egress to the interior of the base supports.

12. The device of claim 11, where the one or more cutouts are oriented to permit the insertion of the forks of a safe mover.

13. The device of claim 9, where the front flange and the back flange are connected along the bottom and side edges of the central pedestal to form a channel from the interior of the base supports.

14. The device of claim 7, where a cutout provides for ingress and egress of power, data, and communications cables connected through the device from exterior sources to the equipment or equipment rack installed upon the device.

15. The device of claim 9, where the central pedestal has a cutout in the central portion of the central pedestal horizontal member.

16. The device of claim 9, where the cavity formed between the bottom surface of the central pedestal and a floor or other horizontal surface is of sufficient vertical dimension to permit the insertion of a moving equipment apparatus.

* * * * *